United States Patent
Ayyagari

(10) Patent No.: US 7,498,862 B2
(45) Date of Patent: Mar. 3, 2009

(54) SWITCH FOR HANDLING TERMINAL VOLTAGES EXCEEDING CONTROL VOLTAGE

(75) Inventor: Ravishankar S. Ayyagari, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/160,879

(22) Filed: Jul. 14, 2005

(65) Prior Publication Data

US 2006/0268476 A1    Nov. 30, 2006

(30) Foreign Application Priority Data

May 31, 2005    (IN) ........................... 658/05

(51) Int. Cl.
*H03K 17/00* (2006.01)
(52) U.S. Cl. .................. 327/387; 327/429; 307/141.8
(58) Field of Classification Search ............... 327/387, 327/429; 307/141.8
See application file for complete search history.

(56) References Cited

U.S. PATENT DOCUMENTS

| | | | | | |
|---|---|---|---|---|---|
| 3,983,414 | A | * | 9/1976 | Stafford et al. | 327/389 |
| 4,459,498 | A | * | 7/1984 | Stengl et al. | 327/436 |
| 4,877,980 | A | * | 10/1989 | Kubinec | 327/110 |
| 5,818,283 | A | * | 10/1998 | Tonami et al. | 327/436 |
| 5,969,560 | A | * | 10/1999 | Kohama et al. | 327/308 |
| 6,380,793 | B1 | * | 4/2002 | Bancal et al. | 327/427 |
| 6,529,056 | B1 | * | 3/2003 | You et al. | 327/170 |
| 6,678,829 | B1 | * | 1/2004 | Teggatz et al. | 713/300 |
| 6,693,498 | B1 | * | 2/2004 | Sasabata et al. | 333/103 |
| 6,876,245 | B2 | * | 4/2005 | de Buda | 327/427 |
| 2001/0040479 | A1 | * | 11/2001 | Zhang | 327/427 |
| 2005/0225373 | A1 | * | 10/2005 | Morita | 327/374 |

FOREIGN PATENT DOCUMENTS

JP    62040820 A    *    2/1987

* cited by examiner

*Primary Examiner*—Michael J Sherry
*Assistant Examiner*—Ann T Hoang
(74) *Attorney, Agent, or Firm*—Warren J. Franz; Frederick J. Telecky, Jr.; Wade J. Brady, III

(57) ABSTRACT

A switch provided between a first terminal and a second terminal with a varying cross terminal voltage. The switch contains two transistors, with the source terminal of the first transistor being coupled to the first terminal and a drain terminal of the second transistor being coupled to the second terminal. The gate terminal of the first transistor is coupled to the first terminal, the gate terminal of the second transistor is coupled to the second terminal, and the drain terminal of the first transistor is coupled to the source terminal of the second transistor. Due to such a topology, the cross-terminal voltage across the first and second terminals can be substantially higher than the voltage of the control signal indicating whether the switch is to be in on or off state.

6 Claims, 4 Drawing Sheets

SWITCH FOR HANDLING TERMINAL VOLTAGES EXCEEDING CONTROL VOLTAGE

RELATED APPLICATION(S)

The present application is related to and claims priority from the co-pending India Patent Application entitled, "SWITCH FOR HANDLING TERMINAL VOLTAGES EXCEEDING CONTROL VOLTAGE", Serial Number: 658/CHE/2005, Filed: May 31, 2005, naming the same inventors as in the subject patent application, and is incorporated in its entirety herewith.

BACKGROUND OF THE INVENTION

1. Field of the Invention

The present invention relates to design of switches in integrated circuits and more specifically to a switch provided between terminals with a terminal voltage potentially exceeding the voltage level of a control signal designed to turn the switch on or off.

2. Related Art

Switches are often used to connect two terminals in an integrated circuit. In general, the two terminals are connected in one state of the switch and disconnected in another state. A control signal specifies the specific state in which the switch is to operate, and thus whether to turn the switch on or off. There is often a need to provide such switches when the cross-terminal voltage exceeds the voltage level of the control signal as described below with reference to an example device of FIG. 1.

FIG. 1 is a block diagram illustrating the operation and details of an example environment in which switches are operated between two terminal with varying terminal voltage (resulting in variations in cross terminal voltage). Device 190 (such as a digital camera or a scanner) receives light 119 emanating from image (object) 110 and generates pixel data elements representing image 110. The pixel data elements may be forwarded on path 168, and used in several ways, for example, viewed/edited by computer system 180_1, stored in floppy disk 180_2, printed on printer 180_3 or transferred to video player 180_4.

Device 190 is shown containing lens 120, CCD (Charge Coupled Device) 130, analog front end (AFE) 100 and post processor 160. Light 119 from image 110 is shown being focused on CCD 130 by lens 120. CCD 130 contains several pixels, with each pixel being charged proportionate to the product of the intensity of the incident light and the time of exposure to the light. The charge is converted into voltage in a known way and transferred to AFE 100 on path 101.

Post processor 160 (example of a processor) processes the digital values received on path 133, generally to enhance the quality of image represented by the digital values and/or to convert the data into suitable format for storing. The resulting output data on path 168 may be used in several ways by one of the external devices, for example, displayed on monitor 180-1, stored on floppy 180-2, printed on printer 180-3, or provided as an input to video camera 180-4.

AFE 100 converts the input signal received on path 101 into digital values representing the image, and transmits the digital values to post processor 160 on path 133. AFE 100 contains (uses) a switch connecting terminals with varying cross-terminal voltage, as described below with reference to FIGS. 2 and 3 below.

FIG. 2 is block diagram illustrating the details of AFE 100 in one embodiment. AFE 100 is shown containing clamping circuit 250, programmable gain amplifier (PGA) 260 and analog to digital converter (ADC) 280. Each block is described below in further detail.

Clamping circuit 250 is shown containing capacitor 210 and switch 220. Capacitor 210 is shown receiving signal on path 101, and switch 220 is shown connected between the other terminal (256) of capacitor 210 and Vdd. Due to such a configuration, clamping circuit 250 operates to clamp a reference point on the input signal (101) to a supply voltage Vdd (at one terminal), and provides the clamped signal on path 256 (as described with reference to FIG. 3 below in further detail).

PGA 260 amplifies the clamped signal with a programable gain (generally set to take advantage of the full range of ADC 280). The amplified signal is provided on path 268. ADC 280 samples the amplified signal received on path 268, and converts each sampled values into a digital code representing the voltage level of the sample. The digital code is provided to post processor 160 as digital input representing the image.

The manner in which capacitor 210 and switch 220 operate as clamping circuit is described below with an example input signal received on path 101. The description further demonstrates the manner in which a varying cross terminal voltage is applied across switch 220.

FIG. 3 is a graph illustrating the clamping operation with respect to an example input signal. The graph is shown containing wave forms 320, 340 and 360. Waveform 320 represents an example input signal received on path 101. The input signal encodes pixel values in a format suitable for recovering according to correlation double sampling (CDS), which implies the pixel value equals the difference of voltage level in durations 321 and 325. The voltage level in duration 321 is represented by V321 (8 Volts in the diagram).

Waveform 340 represents a control signal to switch 220, with a high logic value closing switch (turning on) and logic low opening switch (turning off). Waveform 340 is shown at logic high in durations 321, which charges capacitor 210 to (V331-Vdd). As a result, capacitor 210 acts like a battery with voltage (V331-Vdd) when switch 220 is open in durations 325.

Consequently, when switch 220 is open, the voltage on path 256 equals the difference of the input signal with the battery voltage. The resulting signal is shown on waveform 360. Each pixel value is determined by subtracting a digital value representing a difference of Vdd and the signal level in duration 365.

From the above, it can be readily seen that the cross terminal voltage across switch 220 varies substantially over time (since one terminal is at a substantially fixed voltage Vdd, while the voltage at the other terminal varies as represented by waveform 360). Challenges may be presented in designing such a circuit, as described below with an example implementation of switch 220.

FIG. 4 is a circuit diagram illustrating the details of switch 220 in one prior embodiment. Switch 220 is shown containing PMOS transistor 450 and booster circuit 420. PMOS transistor 450 is shown having drain terminal connected to Vdd and source terminal connected to path 256 (and thus waveform 360).

Booster circuit 420 receives control signal 340 (potentially of low voltage level equaling the operating voltage of AFE 100) and provides a high voltage signal at the gate terminal when waveform 340 is at logic low. The voltage level needs to be high enough to ensure that Vgs is greater than the corresponding pinch-off voltage even for the highest/ maximum value of Vds (which would occur in durations 325 of waveform 360). That is, the high voltage generated by booster circuit is needed to turn off switch 220.

The circuit of FIG. 4 presents various disadvantages. For example, booster circuit may consume unacceptably high power and space, in addition to adding complexities associated with the corresponding implementation. What is therefore needed is a switch addressing one or more of the requirements/disadvantages noted above.

BRIEF DESCRIPTION OF THE DRAWINGS

Various features of the present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of the present invention provides a switch between a first terminal and a second terminal. The switch contains two transistors, with the source terminal of the first transistor being coupled to the first terminal and a drain terminal of the second transistor being coupled to the second terminal. The gate terminal of the first transistor is coupled to the first terminal, the gate terminal of the second transistor is coupled to the second terminal, and the drain terminal of the first transistor is coupled to the source terminal of the second transistor.

Due to such a topology (i.e., gate terminals of the two transistors being coupled to the first and second terminal respectively), the voltage at the gate terminals of the two transistors substantially track the voltage at the corresponding terminal when the switch is to be operated in the off state. As a result, the voltage level at the gate terminal need not be high, thereby obviating the need for components such as boosters noted in the background section above. Accordingly, the switch can operate with higher cross-terminal voltage compared to the voltage level of the control signal.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well_known structures or operations are not shown in detail to avoid obscuring the invention.

2. Example Circuit

Figure 2:
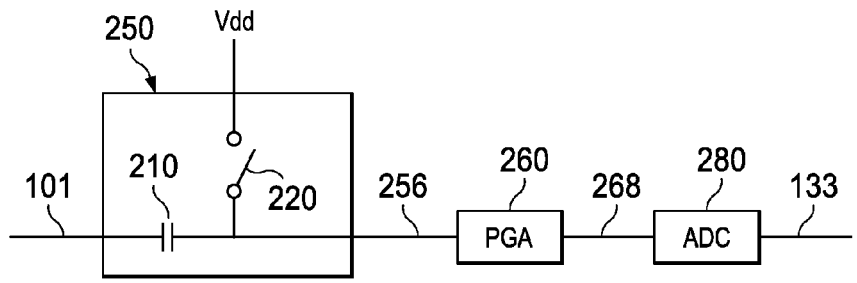
FIG. 2 is block diagram illustrating the details of an analog front end (AFE) in one prior embodiment.
Figure 3:
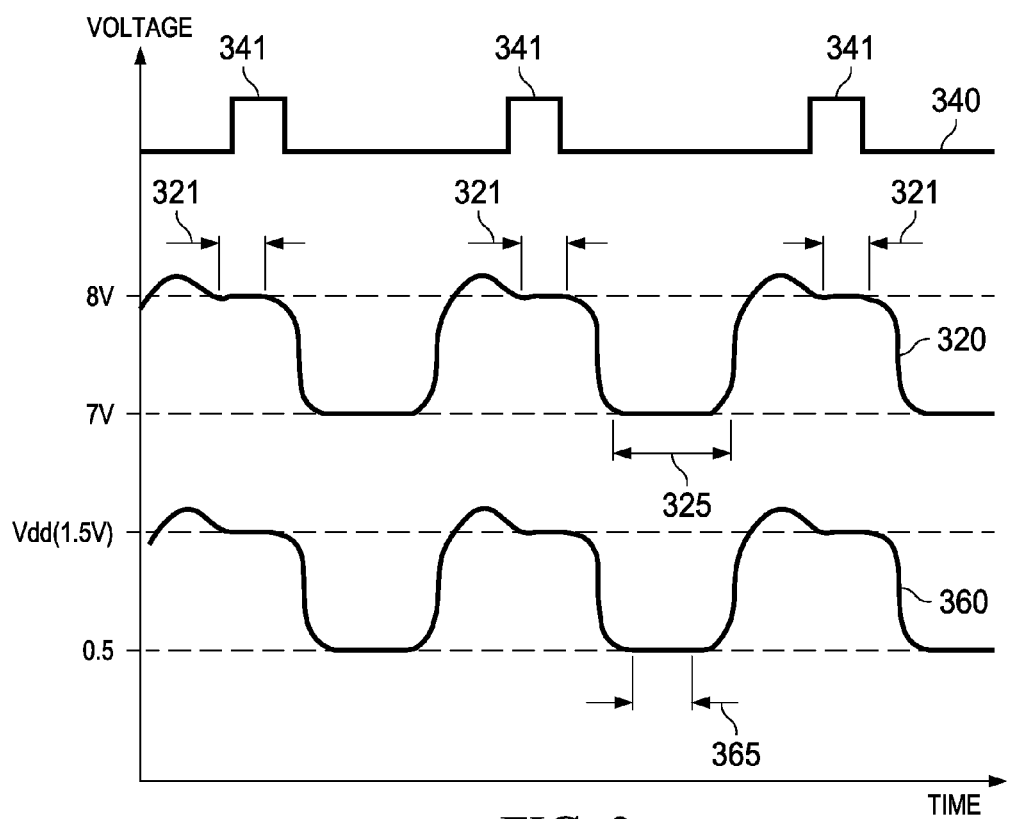
FIG. 3 is a graph illustrating the clamping operation with respect to an example input signal in one prior embodiment.
Figure 4:
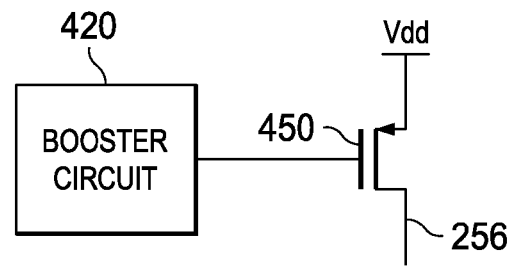
FIG. 4 is a circuit diagram illustrating the details of a switch in one prior embodiment.
Figure 5:
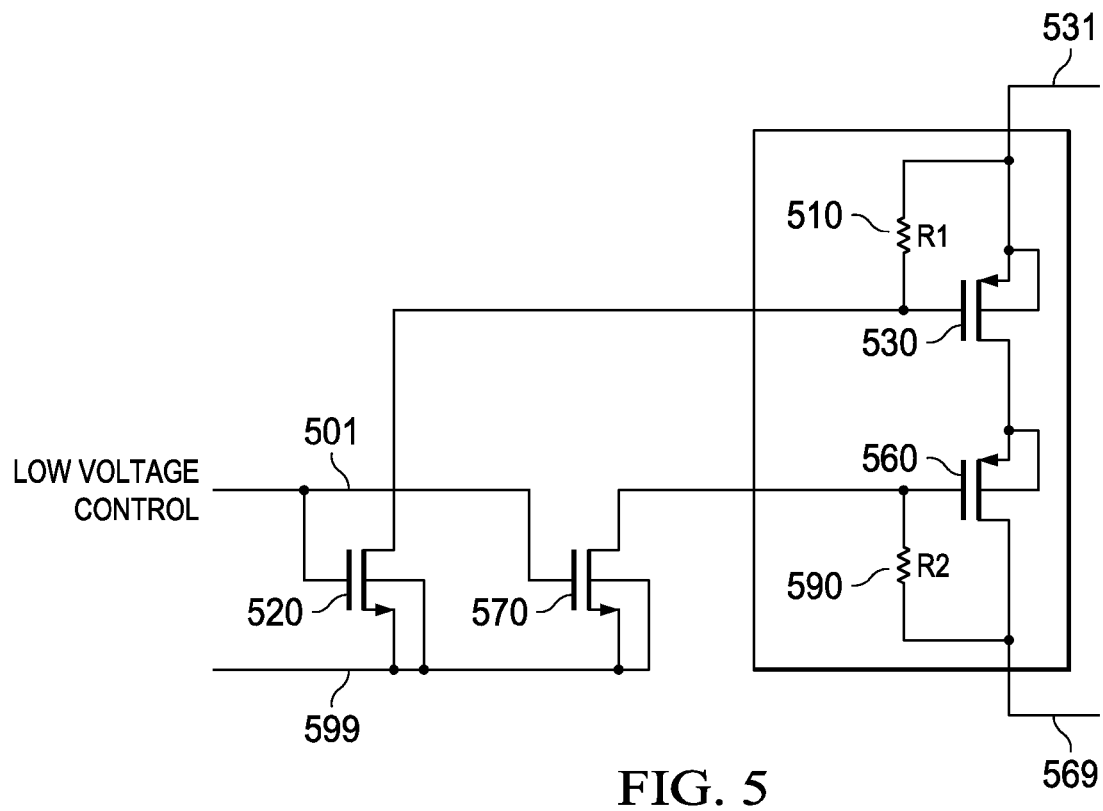
FIG. 5 is a circuit diagram illustrating the details of implementation of a switch according to an aspect of the present invention.

FIG. 5 is a circuit diagram illustrating the details of implementation of a switch according to an aspect of the present invention. The switch can be used in place of switch 220 of FIG. 2. The switch is shown containing PMOS transistors 530 and 560, NMOS transistors 520 and 570, and resistors 510 and 590. The components are described below in further detail.

Broadly, terminals 531 and 569 have a varying cross terminal voltage as terminal 531 is connected to Vdd and terminal 569 is connected to signal such as waveform 360. Control signal 501 specifies the durations in which the switch is to be closed (connecting terminals 531 and 569) and durations in which the switch is to be open. A logic high on signal 501 indicates a desired closed state and logic low a desired open state.

The source terminal of transistor 530 is also connected to terminal 531. The drain terminal of transistor 530 is connected to the source terminal of transistor 560. The drain terminal of transistor 560 is connected to terminal 569.

Resistor 590 connects the gate terminal of transistor 560 to terminal 569. Due to the connection, the gate bias required to maintain transistor 560 in off-state tracks the variations in the voltage at terminal 569. Due to the tracking, the gate bias is changed (increased or decreased) according to the variations in waveform 360. As a result, when the voltage level at terminal 569 is greater than the voltage level at terminal 531, transistor 560 is turned off due to the connection provided by resistor 590.

Similarly, resistor 510 connects the gate terminal of transistor 530 to terminal 531 and provides a similar benefit with respect to terminal 531 and the description is not repeated in the interest of conciseness. As a result, when the voltage level at terminal 531 is greater than the voltage level at terminal 569, transistor 530 is turned off due to the connection provided by resistor 510.

Figure 6:
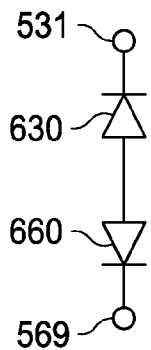
FIG. 6 is a circuit diagram illustrating the logical operation of the switch in an off state in one embodiment.

The operation of transistors 530 and 560 in combination in off-state can be viewed as two diodes 630 and 660 connected back-to-back as depicted in FIG. 6. Thus, even if the polarity of the cross-terminal voltage changes (i.e., from positive to negative or vice versa), a open state would be maintained by one of the transistors.

Continuing with exclusive reference to FIG. 5, control signal 501 is shown connected to the gate terminals of both transistors 520 and 570. The source terminals of both the transistors are connected to ground (599). The drain terminals of transistors 520 and 570 are respectively connected to the gate terminal of transistors 530 and 560 respectively.

Due to such connections, when control signal 501 is at logic high, the gate terminals of both transistors 530 and 560 are pulled to ground, effectively turning on both transistors 530 and 560. Thus, terminal 531 and 561 are connected when control signal 501 is at logic high.

On the other hand, when control signal 501 is at logic low, neither of the gate terminals of transistors 530 and 560 would be connected to ground (via transistors 520 and 570 respectively), and thus the biasing voltage at the gate terminal of transistor 530 would be derived from terminal 531 through resistor 510, and the biasing voltage at the gate terminal of transistor 560 would be derived from terminal 569 through resistor 590.

As summarized above with reference to FIGS. 5 and 6, one of the transistors 530 and 560 would be off depending on the specific voltage of terminals 531 and 569, whichever is higher/lower (the polarity of cross-terminal voltage between). Thus, the switch of FIG. 5 would be in an open state when control signal 501 is at logic low.

It may be noted that a leakage current would be present through resistors 510 and 590 when transistors 520 and 570 are turned on. Such leakage may be acceptable particularly since the current drain otherwise is substantially more through transistors 530 and 560 when in on state. However, the leakage current can be reduced by increasing the resistance of resistors 510 and 590.

Figure 1:
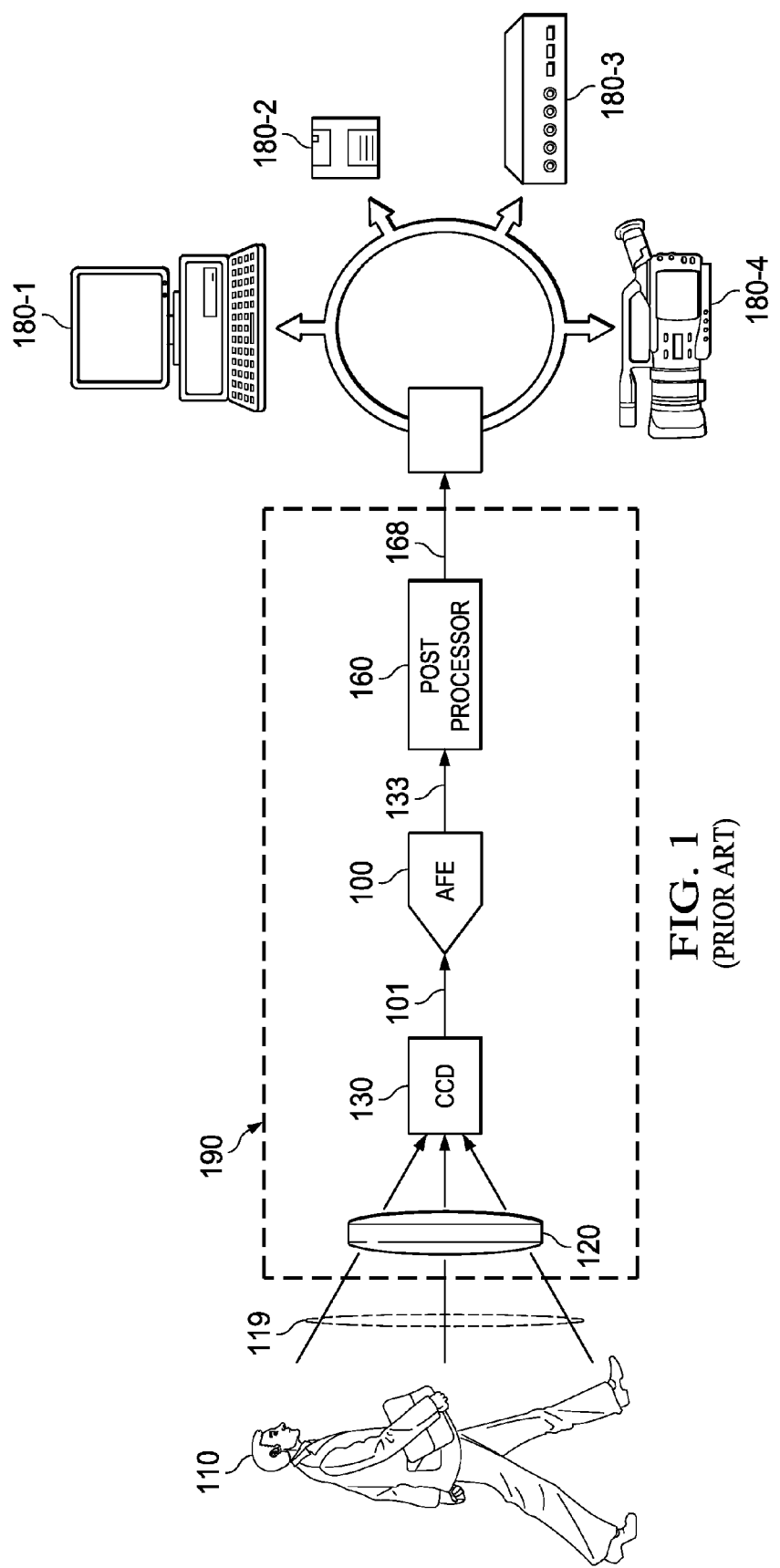
FIG. 1 is a block diagram of a camera/scanner illustrating the operation and details of an example environment in which switches are operated between two terminals with varying cross-terminal voltage.

It should be appreciated that the cross terminal voltage across the terminals of the switch described above can be substantially higher than the operating voltage of an integrated circuit (AFE) in which the switch is implemented. Accordingly, the switch can process signals of a high voltage swing. As such signals can represent input signals containing information/data (e.g., video pixels in the case of FIG. 1), the signal-to-noise-ratio (SNR) can be high in such scenarios.

Also, the control signal used to turn the switch on and off can be of a low voltage (e.g., equaling the operating voltage of the integrated circuit) since the required biasing signal (for transistors 530 and 560) is derived from the voltage at the terminals of the switch (not from the control signal). As also noted above, the varying input signal can be of any polarity (i.e., positive or negative voltage), and the switch continues to operate as desired. Furthermore, the switch of FIG. 5 can be used in several types of devices. For example, the switch can be conveniently used in the place of switch 220 of FIG. 2, in which the input voltage varies depending on the light intensity represented by the corresponding pixel. Thus, terminal 531 can be connected to Vdd, terminal 569 to path 256 and signal 340 can be provided on path 501.

Figure 7:
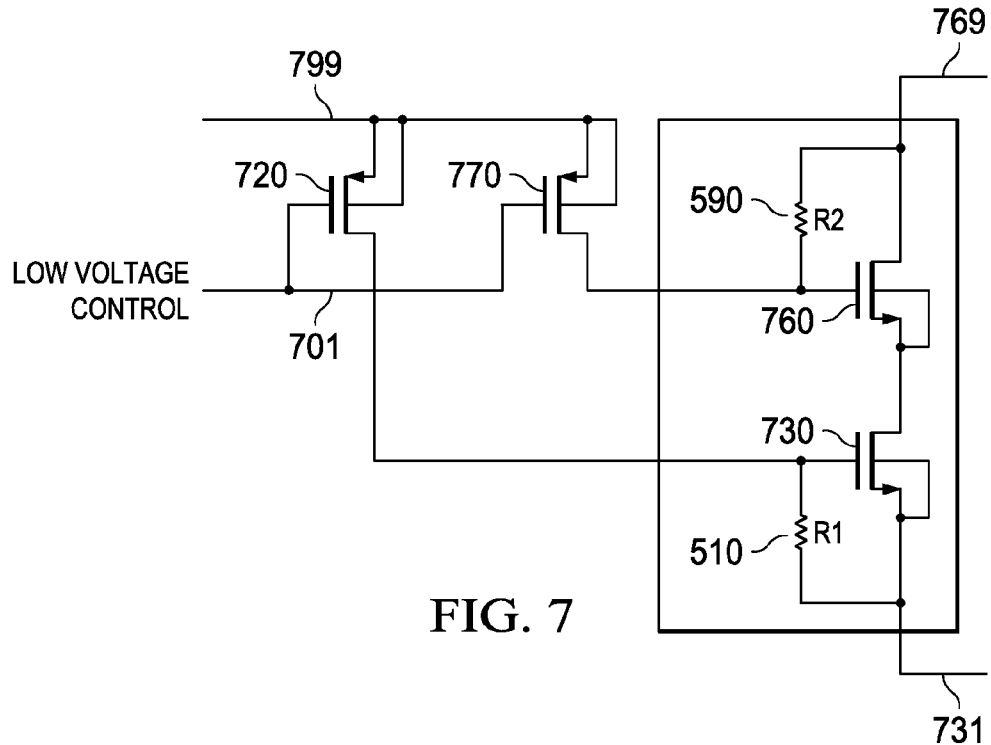
FIG. 7 is a circuit diagram illustrating alternative implementation of a switch according to an aspect of the present invention.

An alternative approach for implementing switch of FIG. 5 is illustrated in FIG. 7. As shown there, PMOS transistors 530 and 560 are replaced with NMOS transistors 730 and 760, and NMOS transistors 520 and 570 are replaced with PMOS transistors 720 and 770. The source terminal of both PMOS transistors 720 and 770 are connected to VDD (799). The switch in FIG. 7 operates similar to the switch in FIG. 5. However, the switch of FIG. 7 handles voltages below ground potential.

3. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A switch, comprising:
 (a) first and second terminals;
 (b) first and second switch transistors connected in series between said first and second terminals, each of said first and second switch transistors being a field effect transistor of a first conductivity type;
 (c) a first biasing resistor connected between the gate of said first switch transistor and said first terminal;
 (d) a second biasing resistor connected between the gate of said second switch transistor and said second terminal; and
 (e) first and second control transistors, each of said first and second control transistors being a field effect transistor of a second conductivity type opposite said first conductivity type, wherein:
  (i) said first control transistor connects between said gate of said first switch transistor and a reference voltage and with the gate of said first control transistor connected to a control input; and
  (ii) said second control transistor connects between said gate of said second switch transistor and said reference voltage and with the gate of said second control transistor connected to said control input;
 wherein said elements are dimensioned, configured and connected so that when one of a logic high or low value is applied at said control input, said first and second control transistors will be rendered conducting to apply said reference voltage as a gate bias to said first and second switch transistors so that said first and second switch transistors will both be rendered in a conducting state to connect said first and second terminals; and when the other of said logic high or low value is applied to said control input, said first and second control transistors will be rendered non-conducting and said gate bias will be determined by voltage at said first and second terminals acting through said first and second biasing resistors to maintain one of said first and second switch transistors in an open state when voltage at said first terminal is higher or lower than voltage at said second terminal, whether or not the polarity of the voltage applied to said first or second terminal is changed.

2. The switch of claim 1, wherein said first conductivity type is p-channel and said reference voltage is ground.

3. A device, comprising:
 (a) a signal input;
 (b) a clamp circuit connected to said signal input; and
 (c) a signal processing circuit connected to said clamp circuit;
 (d) wherein said clamp circuit includes:
  (i) a capacitor with a first plate connected to said signal input and a second plate connected to said signal processing circuit;
  (ii) a switch connected between said second plate and a supply voltage; and
  (iii) a control input for said switch;
 (e) and wherein said switch includes:
  (i) first and second switch transistors connected in series between said supply voltage and said second plate, each of said first and second switch transistors being a field effect transistor of a first conductivity type;
  (ii) a first biasing resistor connected between the gate of said first switch transistor and said supply voltage;
  (iii) a second biasing resistor connected between the gate of said second switch transistor and said second plate; and
  (iv) first and second control transistors, each of said first and second control transistors being a field effect transistor of a second conductivity type opposite said first conductivity type, wherein (A) said first control transistor connects between said gate of said first switch transistor and a reference voltage and with the gate of said first control transistor connected to said control input, and (B) said second control transistor connects between said gate of said second switch transistor and said reference voltage and with the gate of said second control transistor connected to said control input;
 wherein said elements are dimensioned, configured and connected so that when one of a logic high or low value is applied at said control input, said first and second control transistors will be rendered conducting to apply said reference voltage as a gate bias to said first and second switch transistors so that said first and second switch transistors will both be rendered in a conducting state to connect said first and second terminals; and when the other of said logic high or low value is applied to said control input, said first and second control transistors will be rendered non-conducting and said gate bias will be set by voltage at said first and second terminals acting through said first and second biasing resistors to maintain one of said first and second switch transistors in an open state when voltage at said first terminal is higher or lower than voltage at said second terminal, whether or not the polarity of the voltage applied to said first or second terminal is changed.

4. The device of claim 3, wherein said first conductivity type is p-channel and said reference voltage is ground.

5. A switch comprising:
a first terminal connected to a voltage source;
a second terminal at which a varying voltage is developed;
a control signal terminal for receiving a control signal;
a first PMOS transistor having a source coupled to the first terminal, a gate and a drain;
a second PMOS transistor having a source coupled to the drain of the first PMOS transistor, a drain coupled to the second terminal, and a gate;
a first resistor coupled between the source and the gate of the first PMOS transistor;
a second resistor coupled between the gate and the drain of the second PMOS transistor;
a first NMOS transistor having a gate coupled to the control signal terminal, a source connected to ground, and a drain coupled to the gate of the first PMOS transistor; and
a second NMOS transistor having a gate coupled to the control signal terminal, a source connected to ground, and a drain coupled to the gate of the second PMOS transistor;
whereby, when the control signal terminal is at logic high, the first and second NMOS transistors will be turned on to pull to ground the gate terminals of the first and second PMOS transistors, effectively turning on both PMOS transistors, connecting the first and second terminals; and, when the control signal is at logic low, the first and second NMOS transistors will be turned off so that neither of the gate terminals of the first and second PMOS transistors will be connected to ground, and voltage at the gate of the first PMOS transistor will be set by the voltage at the first terminal through the first resistor and voltage at the gate of the second PMOS transistor will be set by the voltage at the second terminal through the second resistor in such way that at least one of the first and second PMOS transistors will be left in an open state when the control signal is at a logic low, even if polarity of voltage applied to the first or second terminal is reversed.

6. A switch comprising:
a first terminal connected to a voltage source;
a second terminal at which a varying voltage is developed;
a control signal terminal for receiving a control signal;
a first NMOS transistor having a drain coupled to the first terminal, a gate and a source;
a second NMOS transistor having a drain coupled to the source of the first NMOS transistor, a source coupled to the second terminal, and a gate;
a first resistor coupled between the drain and the gate of the first NMOS transistor;
a second resistor coupled between the gate and the source of the second NMOS transistor;
a first PMOS transistor having a gate coupled to the control signal terminal, a source connected to a positive voltage source, and a drain coupled to the gate of the first NMOS transistor;
a second PMOS transistor having a gate coupled to the control signal terminal, a source connected to the positive voltage source, and a drain coupled to the gate of the second NMOS transistor;
whereby, when the control signal terminal is at logic low, the first and second PMOS transistors will be turned on to pull to a positive voltage the gate terminals of the first and second NMOS transistors, effectively turning on both NMOS transistors, connecting the first and second terminals; and, when the control signal is at logic high, the first and second PMOS transistors will be turned off so that neither of the gate terminals of the first and second NMOS transistors will be connected to the positive voltage, and voltage at the gate of the first NMOS transistor will be set by the voltage at the first terminal through the first resistor and voltage at the gate of the second NMOS transistor will be set by the voltage at the second terminal through the second resistor in such way that at least one of the first and second NMOS transistors will be left in an open state when the control signal is at a logic high, even if polarity of voltage applied to the first or second terminal is reversed.

* * * * *